United States Patent
Lindfors et al.

(10) Patent No.: US 6,881,263 B2
(45) Date of Patent: Apr. 19, 2005

(54) METHOD OF GROWING A THIN FILM ONTO A SUBSTRATE

(75) Inventors: Sven Lindfors, Espoo (FI); Pekka T. Soininen, Helsinki (FI)

(73) Assignee: ASM Microchemistry Oy, Espoo (FI)

( * ) Notice: Subject to any disclaimer, the term of this patent is extended or adjusted under 35 U.S.C. 154(b) by 0 days.

(21) Appl. No.: 10/333,521

(22) PCT Filed: Jul. 20, 2001

(86) PCT No.: PCT/FI01/00680

§ 371 (c)(1),
(2), (4) Date: Apr. 1, 2003

(87) PCT Pub. No.: WO02/08488

PCT Pub. Date: Jan. 31, 2002

(65) Prior Publication Data

US 2003/0224107 A1 Dec. 4, 2003

(30) Foreign Application Priority Data

Jul. 20, 2000 (FI) .......................................... 20001694

(51) Int. Cl.[7] .......................... C30B 25/04; C30B 25/02
(52) U.S. Cl. ........................ 117/105; 117/101; 117/102
(58) Field of Search .......................... 117/89, 101, 102, 117/105, 201, 202

(56) References Cited

U.S. PATENT DOCUMENTS 4,413,022 A  11/1983  Suntola et al.
6,015,590 A  1/2000  Suntola et al.

FOREIGN PATENT DOCUMENTS

| EP | 0 671 484 A1 | 3/1994 |
| WO | WO 01/27347 A1 | 4/2001 |
| WO | WO 01/29280 A1 | 4/2001 |

OTHER PUBLICATIONS

"ALD Precursor Chemistry: Evolution and Future Challenges"; Leskelä, et al; J. Phys IV France 9 (1999) ; pp. 837–845.*

* cited by examiner

Primary Examiner—Felisa Hiteshew
(74) Attorney, Agent, or Firm—Knobbe, Martens, Olson & Bear, LLP.

(57) ABSTRACT

The present invention relates to the production of thin films. In particular, the invention concerns a method of growing a thin film onto a substrate, in which method the substrate is placed in a reaction chamber and is subjected to surface reactions of a plurality of vapor-phase reactants according to the ALD method. The present invention is based on replacing the mechanical valves conventionally used for regulating the pulsing of the reactants, which valves tend to wear and intrude metallic particles into the process flow, with an improved precursor dosing system. The invention is characterized by choking the reactant flow between the vapour-phase pulses while still allowing a minimum flow of said reactant, and redirecting the reactant at these times to an other destination than the reaction chamber. The redirection is performed with an inactive gas, which is also used for ventilating the reaction chamber between the vapour-phase pulses.

36 Claims, 6 Drawing Sheets

METHOD OF GROWING A THIN FILM ONTO A SUBSTRATE

This is the U.S. national phase under 35 U.S.C. § 371 of International Application PCT/FI01/00680, filed Jul. 20, 2001.

BACKGROUND OF THE INVENTION

1. Field of the Invention

The present invention relates to the production of thin films. In particular, the invention concerns a method of growing a thin film onto a substrate, in which method the substrate is placed in a reaction chamber and it is subjected to surface reactions of a plurality of vapor-phase reactants according to the ALD method to form a thin film.

2. Description of Related Art

Conventionally, thin films are grown out using vacuum evaporation deposition, Molecular Beam Epitaxy (MBE) and other similar vacuum deposition techniques, different variants of Chemical Vapor Deposition (CVD) (including low-pressure and metallo-organic CVD and plasma-enhanced CVD) or, alternatively, the above-mentioned deposition process based on alternate surface reactions, known in the art as the Atomic Layer Deposition, in the following abbreviated ALD, formerly also called Atomic Layer Epitaxy or "ALE". Commercially available equipment and processes are supplied by ASM Microchemistry, Espoo, Finland, under the trade mark ALCVD™.

In the MBE and CVD processes, besides other variables, the thin film growth rate is also affected by the concentrations of the starting material inflows. To achieve a uniform surface smoothness of the thin films manufactured using these methods, the concentrations and reactivities of the starting materials must be kept equal on one side of the substrate. If the different starting materials are allowed to mix with each other prior to reaching the substrate surface as is the case in the CVD method, the possibility of mutual reactions between the reagents is always imminent. Herein arises a risk of microparticle formation already in the in feed lines of the gaseous reactants. Such microparticles generally have a deteriorating effect on the quality of the deposited thin film. However, the occurrence of premature reactions in MBE and CVD reactors can be avoided, e.g., by heating the reactants not earlier than only at the substrates. In addition to heating, the desired reaction can be initiated with the help of, e.g., plasma or other similar activating means.

In MBE and CVD processes, the growth rate of thin films is primarily adjusted by controlling the inflow rates of starting materials impinging on the substrate. By contrast, the thin film growth rate in the ALD process is controlled by the substrate surface properties, rather than by the concentrations or other qualities of the starting material inflows. In the ALD process, the only prerequisite is that the starting material is provided in a sufficient concentration for film growth on the substrate.

The ALD method is described, e.g., in FI Patents Nos. 52,359 and 57,975 as well as in U.S. Pat. Nos. 4,058,430 and 4,389,973. Also in FI Patents Nos. 97,730, 97,731 and 100,409 are disclosed some apparatus constructions suited for implementing the method. Equipment for thin film deposition are further described in publications Material Science Report 4(7), 1989, p. 261, and Tyhjiötekniikka (title in English: Vacuum Techniques), ISBN 951-794-422-5, pp. 253–261.

In the ALD method, atoms or molecules sweep over the substrates thus continuously impinging on their surface so that a fully saturated molecular layer is formed thereon.

According to the conventional techniques known from FI Patent Specification No. 57,975, the saturation step is followed by a protective gas pulse forming a diffusion barrier that sweeps away the excess starting material and the gaseous reaction products from the substrate. Intermixing of the successive reactant pulses must be avoided. The successive pulses of different starting materials and the protective gas pulses forming diffusion barriers that separate the successive starting materials pulses from each other accomplish the growth of the thin film at a rate controlled by the surface chemistry properties of the different materials.

As known in the state of the art, dosing of precursors with a high vapor pressure, e.g. TMA and $H_2O$, makes it possible to use valves, which are operated at ambient temperature. As explained in our earlier patents the "inert gas valving", comprising a diffusion barrier and a drain operated at ambient conditions, has made it possible to use the ALD process with these high vapor pressure materials. In the following, inert gas valving will be also referred to in the abbreviated form "IGV". It is disclosed and discussed in more detail in our copending U.S. patent application Ser. No. 09/835,931 filed on Apr. 16, 2001, the content of which is herewith incorporated by reference. Today there is a growing interest for the use of low vapor pressure solid precursors. The source temperatures can rise up to above 500° C. This is the case for, e.g., MnCl doping of ZnS phosphors. This puts stringent demands on the valves employed for controlling the dosing. Also the use of the IGV is somewhat complicated due to solid condensation of the precursor in the ambient operated drain capillary, which can become blocked and by that ending the proper function of the IGV, causing failure of the process. In single wafer cluster systems, down time for cleaning of drain capillaries and replacing source tubes after each run is not acceptable, contrary to the situation for batch type multi layer processing of thin film displays.

Due to the cyclic nature of ALD processing conventional valves cannot be solo adapted for this kind of a process. The aggressive source media destroy the valve rapidly at such conditions.

In the low vapor pressure dosing system for ALD systems, the cyclic injection of a precursor into an ALD process requires a valve controlling the dosing. A mean time between failure of 20–40 million cycles would be preferable for such a valve for production reasons. In the earliest ALD reactor constructions, solenoid-type valves were mainly used employing valve seal materials of different kinds of elastomers or polymers. Later on, pneumatic valves with metal membranes and metal seats have been used. When aggressive precursors are used at elevated temperatures, involving continuous closing actions, the result is rapid wear of the valve seal. Even pneumatically activated metal membrane valves release metallic particles into the process flow at such conditions. A solenoid valve often creates abrasive products as a result of the steam grinding the solenoid housing. For purity and safety reasons small, convenient sized solenoids are not preferred in chemical vapor deposition equipment.

Mass Flow Controllers (in the following abbreviated "MFC") are widely used for controlling the precursor dosing into conventional (not pulsing) CVD systems but they cannot be used for fast pulsing ALD systems due to their slow response (long response times). At ambient conditions, pneumatic valves can tolerate only 0.2–4 million cycles due to wear out of actuator seals and deformation of the valve steam and valve seat. This is because of forces acting on the valve. At elevated temperatures the tolerance is close to zero. This is particularly disadvantageous for ALD processing where the valve operates 100 to 10,000 times during one process. The heat produced by the friction of the actuator piston movement increases quickly because of rapid pulsing. By contrast, in conventional chemical vapor deposition the precursor valve operates only twice during one process.

Thus, as explained in earlier ALD patents and will have become apparent to a person skilled in the art from the above description, a fast acting dosing (pulsing) system with non-wear valves (low-particle level) characteristics would be essential for improved ALD processing.

SUMMARY OF THE INVENTION

It is an object of the present invention to eliminate the problems of the prior art and to provide a novel method of growing a thin film onto a substrate placed in a reaction chamber according to the ALD process. In particular, it is an object of the invention to provide a method in which the ALD process can be operated with increased reliability and reduced downtime caused by wear of the process equipment.

These and other objectives, together with the advantages thereof over known processes, which shall become apparent from the following specification, are accomplished by the invention as hereinafter described and claimed.

Generally, the present invention is based on the idea that leak-tight mechanical valves conventionally used for regulating the pulsing of the reactants, i.e. the flow of reactants from precursor sources to the reaction chamber, are replaced by an improved precursor dosing system including. In particular, the flow of the reactant from the reactant source to the reaction chamber is regulated with a regulating means, which provides choking of the reactant flow, while still allowing a minimum flow of said reactant between the vapour-phase pulses. At the same time, the process is controlled by inert gas valving. Such a system can be implemented by arranging feeding inactive (mostly inert) gas into the conduit which interconnects the reactant source with the reaction chamber (in the following called the "first conduit") via a second conduit, which is connected to the first conduit at a connection point. This inactive gas is fed during the time interval between the vapour-phase pulses of the reactant so as to form a gas phase barrier against the flow of vaporised reactants from the reactant source via the first conduit into the reaction chamber. The inactive gas from the first conduit is withdrawn via a third conduit connected to the first conduit. The third conduit being maintained at a temperature equal to or higher than the condensation of the vapour-phase reactant and being connected to the first conduit at a point upstream of the second conduit. As a result there is formed in the first conduit, along at least of length of that conduit, a gas flow which is directed in the opposite direction to the reactant pulse feed. That gas flow will form a gas blow barrier.

As a result of the combination of inert gas valving with a valve system which provides choking of the gas flow, while allowing a minimum, usually less than 5%, in particular less than 1% of the full flow (when the valve is fully open), the ALD process can be operated for source materials which have low vapour pressure and which therefore need high vaporization temperatures.

More specifically, the method according to the present invention is characterized by what is stated in the characterizing part of claim 1.

Further details of the invention are apparent from the depending claims.

Considerable improvements are obtained by means of the invention. Thus, by means of the presented process, moving mechanical parts can be avoided in the area operated at temperatures above the precursor evaporation temperature. Reactant flow can be blocked without involving any large forces in the operation of the pulsing valves. This will result in negligible wear of valve steams and valve seats. The process is reliable and provides high productivity performance at low costs for any ALD system produced.

The operation of the present regulating mechanism, in the following also called "inert gas valving" is reliable and it is not sensitive to variations in the chemical character of the precursors. Since it includes no mechanical moving parts, the investment costs and the need for maintenance work is strongly reduced. As will be discussed in more detail below, by the inert gas valving system, pulsing of reactants can be carried out by using only one valve which controls the flow of carrier gas from the source of inactive or inert gas to the precursor source. This valve can be kept at ambient temperature and it is not in direct contact with the reactants. By maintaining the temperature of the draining conduit above the evaporation temperature of the reactant, condensation of the reactant in the hot zone of the apparatus can be avoided. There is no build-up of condensated reactants in the third conduit during the purge phase. All parts of the equipment are kept cleaner and less particles are formed which could be forwarded to the reaction chamber.

Next, the invention will be examined more closely with the aid of the following detailed description and with reference to the appended drawing.

DETAILED DESCRIPTION OF THE INVENTION

Figure 1A:
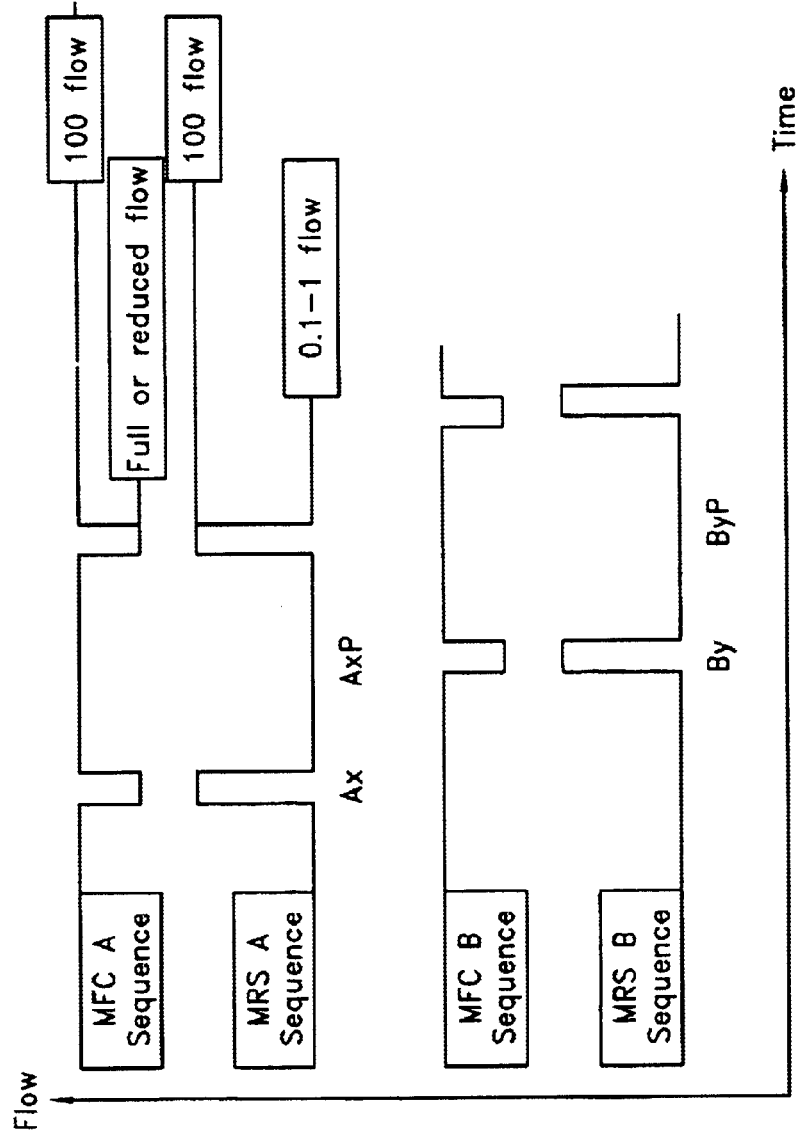
FIG. 1a depicts a chart for the flow or reagents A and B and FIG. 1b shows the principal configuration of a process lay-out according to the present invention.

The present invention provides a method of growing a thin film onto a substrate, in which method a substrate is placed in a reaction chamber and said substrate is subjected to surface reactions of a plurality of vapor-phase reactants according to the ALD method to form a thin film.

The method comprises generally the steps of vaporising a reactant from a reactant source, conducting the vaporised reactant to the reaction chamber via a first conduit, feeding said reactant into said reaction chamber in the form of vapour-phase pulses repeatedly and alternately with vapour-phase pulses of at least one other reactant, and causing said vapour-phase reactants to react with the surface of the substrate at a reaction temperature to form a thin film compound on said substrate. The vaporised reactant can be conducted through a purifier before feeding it into the reaction chamber.

The present invention comprises basically replacing leak-tight mechanical valves conventionally used for regulating the pulsing of the reactants by an improved precursor dosing system including: Modulated Carrier Gas flow, Precursor Transfer gas, Flow Ratio Sequencer device, Inert Gas valve with Hot Drain system.

In practice the IGV controlling part of the invention can be implemented by feeding inactive gas into the conduit interconnecting the reactant source and the reaction chamber—that conduit will be called in the following the "first conduit"—, via a second conduit, connected to the first conduit at a connection point. The inactive gas is then withdrawn from the first conduit via a draining conduit (in the following the "third" conduit) connected to the first conduit. The third conduit by-passes the reactor and it is maintained at a temperature equal to or higher than the condensation of the vapour-phase reactant. By connecting the third conduit to the first conduit at a point upstream of the connection point of the second conduit it becomes possible to form a gas phase barrier which is opposite directed to the flow of vaporised reactants from the reactant source via the first conduit into the reaction chamber.

Together with the IGV, the present invention employs a non leak proof valve which will choke the flow of gas, although there will be allowed a minimum flow. Typically the flow is regulated with a valve having an open and closed position such that the flow through the valve in the closed position is 1/10–10,000 of the flow of the open position of the valve. Preferably the flow is less than about 5%, in particular less than 1% of the flow through the open valve. The valve used has, according to a preferred embodiment a response time of less than 100 ms, in particular less than 50 ms.

Among the valves, which can be used, the following can be mentioned:
a valve disc operated by the precursor transfer gas and gravity;
a modified MFC solenoid operated throttle valve; and
a pneumatic membrane type valve.

Another preferred embodiment comprises choking the same side carrier gas in parallel with the precursor pulse being injected at a time. It is also possible to choke the opposite side carrier gas in parallel with the precursor pulse being injected at a time.

Figure 1B:
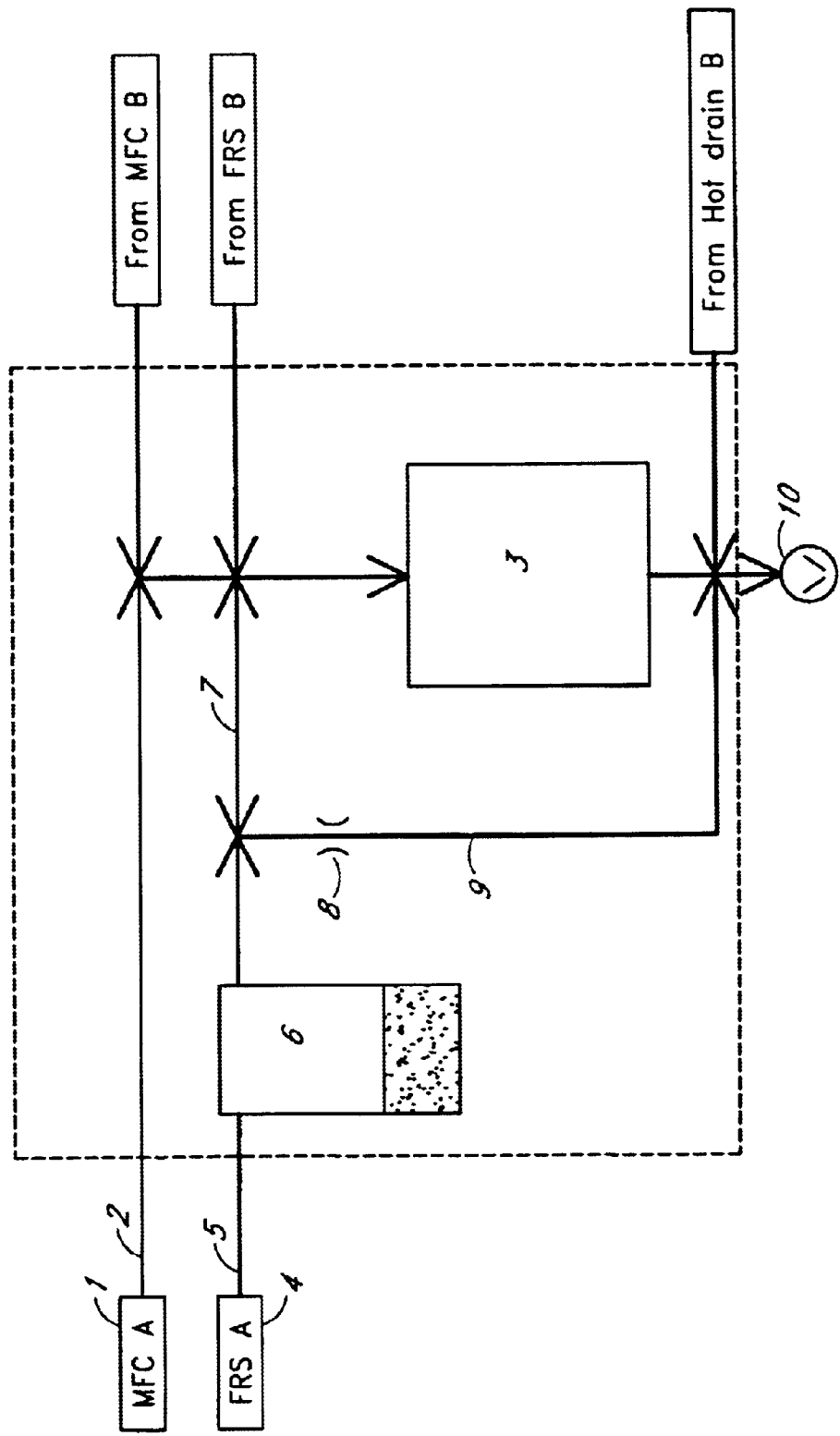

The following description of the operation sequence, which refers to FIG. 1, starts from the system being in stand-by purge mode with carrier gas MFC at 100% flow. The FRS is choked, the source temperature is activated and the system is under vacuum. Thus, in accordance with FIG. 1 the MFC 1 is feeding the carrier gas via a conduit 2 into the reaction space 3, providing for the purge of the reaction space when the precursor injection is off. The reaction space is emptied by the vacuum pump 10.

The Flow Ratio Sequencer FRS 4 is choking the precursor transfer inert gas flow during the purge cycle, into a sufficient flow of 0.05 sccm to a few sccm that will protect the upstream gas line 5 and the FRS from problems related to condensation of the precursor into the upstream gas lines. The FRS controlled inert gas leak will direct the precursor diffusing from the source 6 via the Hot drain capillary 8 into the vacuum pump 10 assisted by the Diffusion Barrier 7 gas flow, preventing that said precursor of entering the reaction space 3 at a time when the other precursor is interacting in the reaction space.

Simultaneously with the carrier gas MFC being choked the precursor transfer flow becomes non-choked by the FRS and the inert gas will flush the source, overcome the diffusion barrier flow, transferring the precursor to the reaction space. The reduced flow of the carrier gas during the precursor pulse increases the concentration of the precursor doze thus aiding the saturation of the surface with the precursor molecules. In order to improve the spreading of the precursor additionally into the reaction space the flow of both side carrier gas MFC's can be reduced during the precursor pulse. Example of a flow diagram illustrating this principle is presented in FIG. 1b.

The diffusion barrier is formed by inert or inactive gas in the conduit interconnecting the reactant source with the reaction chamber. These gas barriers are generated in the time interval between two successive pulses of the same reactant gas. The time interval typically includes a purge pulse, a pulse of another reactant and a further purge pulse.

The Flow Ratio Sequencer FRS 4 contains a modulating actuator, preferably a fast acting piezoelectric valve or MFC without any abrasive moving parts that could produce particles to enter the gas flow. The controller should be able to control the gas flow with response times below 100 ms.

When the FRS is choked a small controlled leak of an inert gas is fed into the heated Precursor Source 6 via conduit 5 preventing the diffusion of the precursor material into the upstream conduit and the FRS where condensation of the material would occur. The leaking transfer gas with a small amount of the precursor material is conducted into conduit 9 containing the Hot Drain capillary 8 which controls the Inert Gas Valve flow in the Diffusion Barrier path 7 preventing the precursor of entering the reaction space in a non-controlled way.

As mentioned above, the non-fully closing valve used in the invention will strongly choke the gas flow although it will still allow a small through-flow (a gas leak flow) in "closed" position. The reduction of the gas flow from open to closed position must nevertheless be such that it is possible essentially to prevent intermixing of reactor pulses by using the IGV. As mentioned above, the flow through the valve in the closed position is preferably about 1/10–10000 of the flow of the open position of the valve.

In accordance with the invention there are many alternative solutions for placing the non-closing valve in the process. For example the non-fully closing valve can be placed inside the flow ratio sequencer 4 or between the flow ratio sequencer 4 and the precursor source 6.

Further, the non-fully closing valve may be placed in the normal flow direction after the precursor source 6 or even in the conduit 9 for hot drain capillary 8.

One kind of FRS device is available from Engineering Measurements Company, Longmont USA, with brand name of Mach-One. Pat. WO 98/37343.

It can be used as a ratio controlled valve with a leak rate of 0.03 sccm providing a turndown ratio of for example 100:1 (open:close), enabling by that a non-closing type valve when operated combined with the inert gas switching valve.

When the FRS is used as the carrier gas mass flow controller, operated in synchrony with the opposite pulsing valve, it enables additionally a gradient free non-diluted distribution of the precursors into the reaction space.

Other suppliers of suitable fast acting valves suitable for Flow Ratio controlled ALD valve system applications are: Horiba Ltd, Kyoto, Japan. Fujikin Incorporated, Japan, Brooks Instruments, Hatfield, USA.

The basic demand for the component is non-fully closing, fast responding (<100 ms), with for example 100:1 turndown ratio, preferably>20 million cycle durability proven. There are, of course, many other suppliers of such valves that could be modified for this application without departing from the scope of this invention. The scope of this invention is the combination of a flow ratio controlling fast acting valve, combined with the Inert Gas Valve providing together a novel, productive ALD process for growing a thin film onto a substrate.

Figure 2A:
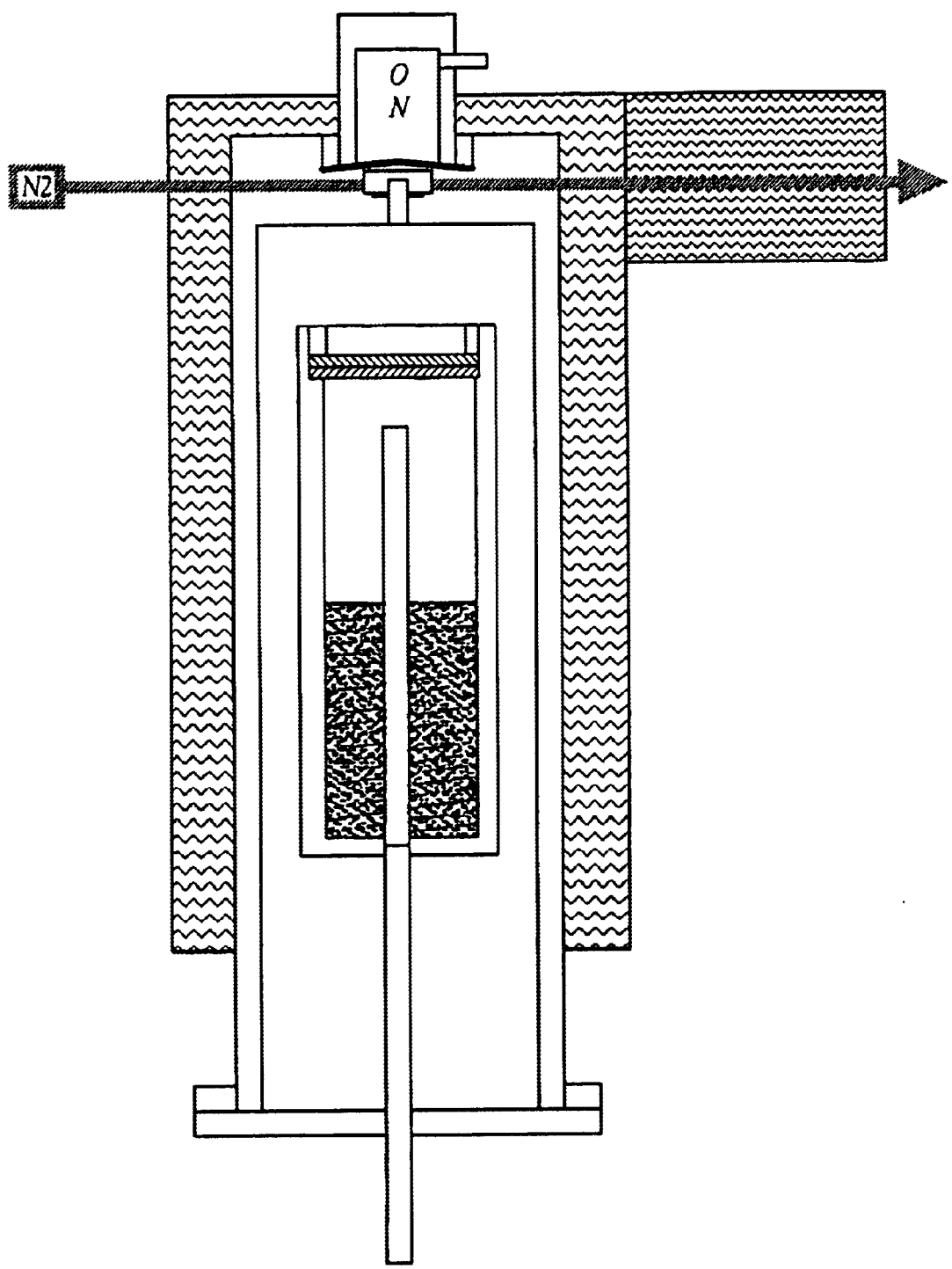
FIG. 2a is a sectional side view of a source with pre-tensioned metal membrane and pneumatic control in an open position in accordance with the present invention.
Figure 2B:
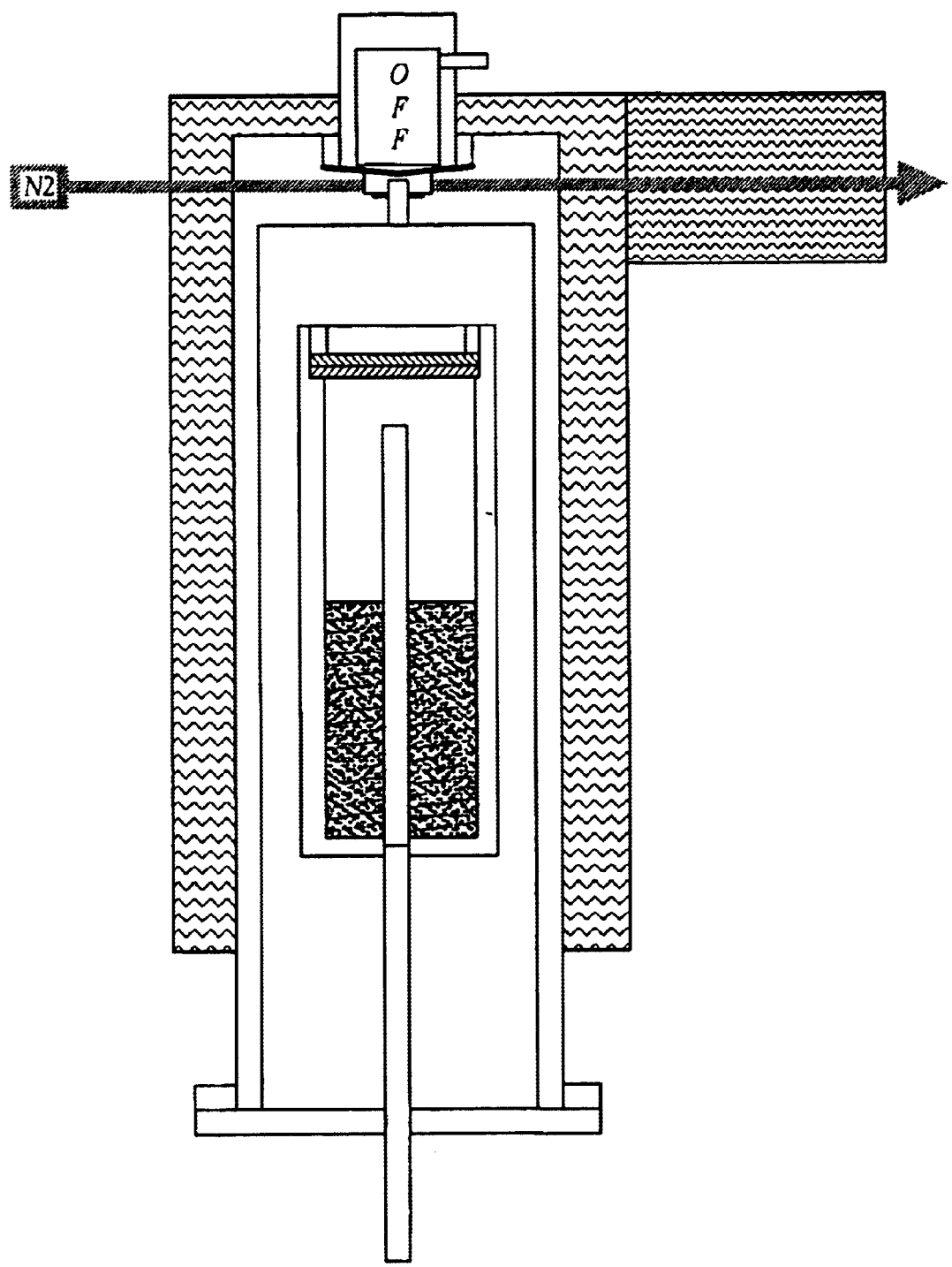
FIG. 2b is a sectional side view of a source with pre-tensioned metal membrane and pneumatic control in a closed position in accordance with the present invention.

Another embodiment comprises pneumatic "all metal" membrane type valves, (FIGS. 2a and 2b) which enable the use of the valve in strongly elevated temperatures. Combined with the IGV no leak tight performance is needed and by that no large closing force.

Figure 3:
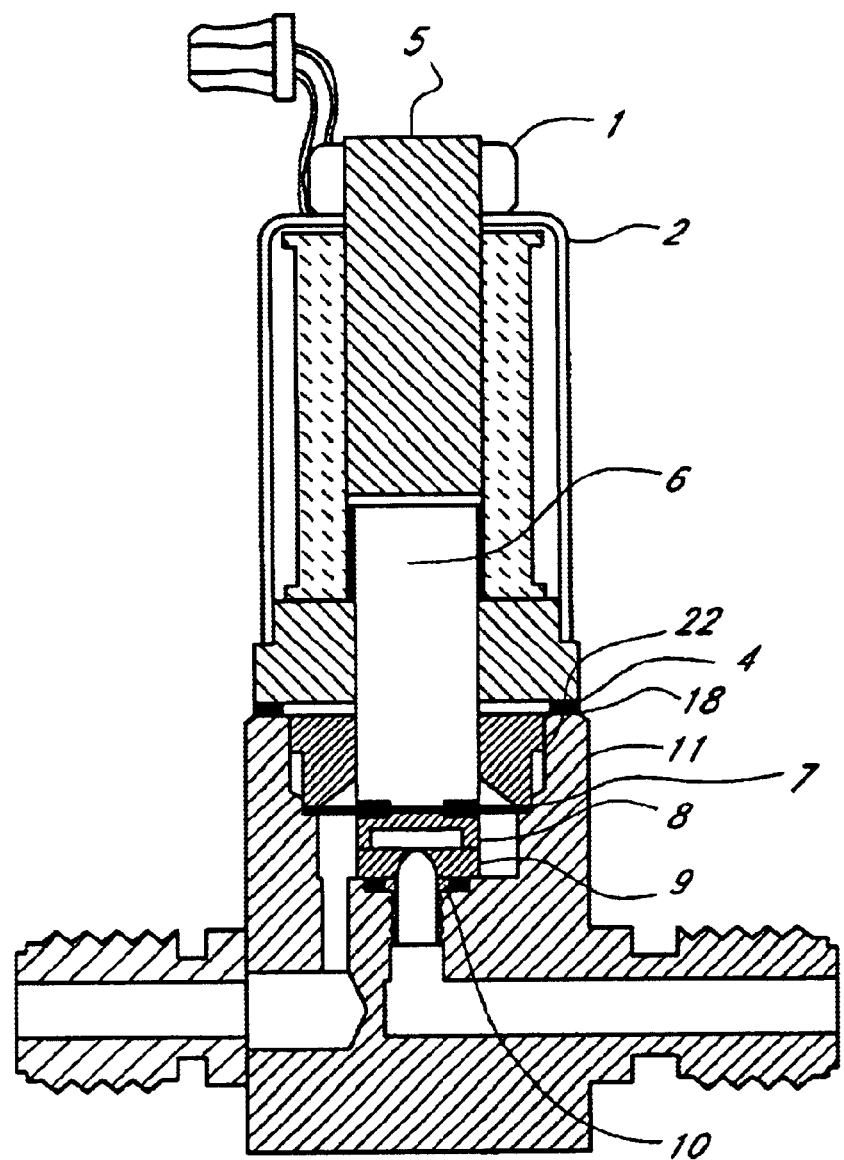
FIG. 3 is a sectional side view of a solenoid operated throttle valve in accordance with the present invention.

Other actuator elements than solenoid steams can be used. The embodiment in FIG. 3 shows a modified solenoid operated throttle valve, based on a centrally fixed spring mounted solenoid steam and is modified from an ordinary MFC provided by Brooks Instruments.

Figure 4:
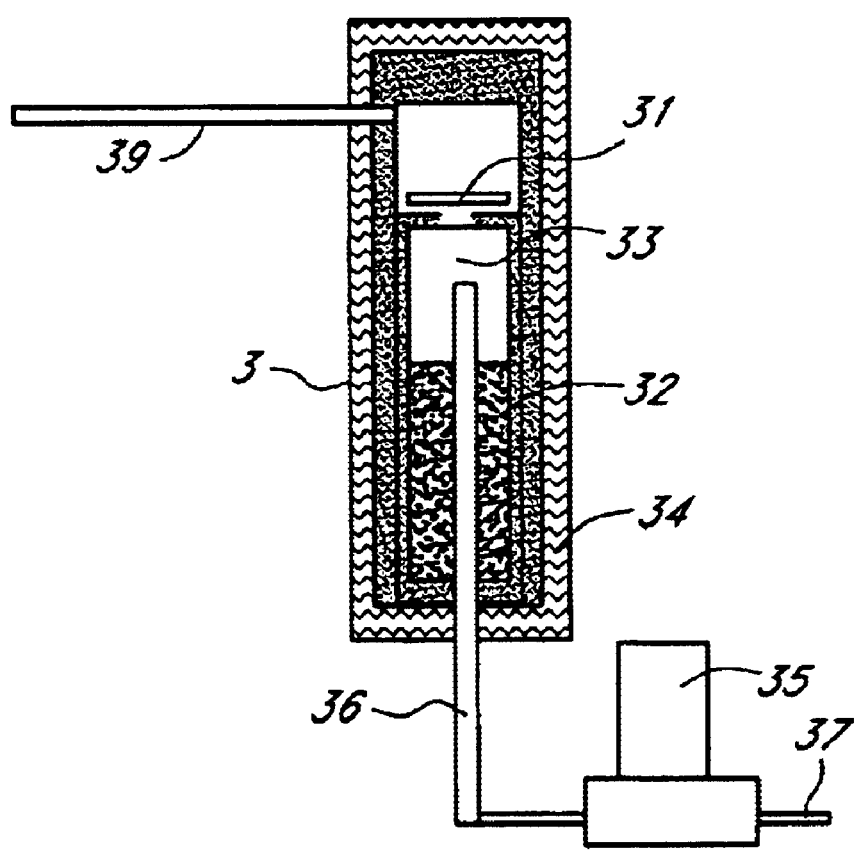
FIG. 4 is a sectional side view of a disc valve source in accordance with the present invention.

The embodiment of FIG. 4 shows a disc valve where the closing disc is moved by the: dosing precursor transfer inert gas pulse, transferring the precursor into the reaction space. When the transfer gas pulse is closed, the disc will set on the valve seat by gravity, thus closing the source opening with a sufficient ratio (>100-1) providing closing conditions for the IGV.

In the drawing, the following reference numerals are used:
31. Valve disc
32. Precursor
33. Vaporized precursor
34. Heating envelope
35. Flow Ratio Sequencer
36. Transfer gas injection conduit
37. Transfer gas inlet
38. Valve body
39. Conduit to inert gas valve According to the invention it is also essential that the regulating means, which provides for choking of the reactant is operated in conjunction with inert gas valving (IGV). The IGV is operated as follows:

Inactive gas is used for forming a gas phase barrier, which prevents leaking of reactant from the reactant feed conduit into the reaction chamber during purging and during feed of another reactant. Thus, the present invention comprises generating a gas phase barrier in the conduit interconnecting the reactant source and the reaction chamber at some point of the conduit either before or after the purifier. The gas phase barrier preferably comprises a flow of inert (in the following more generally "inactive" gas) which is directed in the opposite direction to the flow of vaporized reactant. The point at which the inactive gas is introduced from a second conduit into the first conduit is positioned downstream (with respect to the normal flow direction of the reactant gas from the source to the reaction chamber) from the point at which the inactive gas is withdrawn from the conduit. Thus, at least for some length of the first conduit, the inactive gas fed via the second conduit is conducted in opposite direction to the reactant flow.

Summarizing, the barrier zone of the first conduit (which comprises the length of the first conduit between the connecting points of the second and the third conduits) exhibits a gas flow, which is generally directed toward the reactor during pulsing and toward the reactant source during the purge cycle. There may also be formed a barrier zone in the third conduit for reducing the waste of reactant during pulsing.

In the present context, the term "inactive" gas is used to refer to a gas which is admitted into the reaction space and is capable of preventing undesired reactions related to the reactants and the substrate, respectively. In the method according to the invention, the inactive gas is also used advantageously as the carrier gas of the vapor-phase pulses of the reactants and, in particular, for providing a gas barrier to the flow of reactant residues into the reaction chamber during the purging of the reaction chamber. Of inactive gases suited for use in the method, reference can be made to inert gases such as nitrogen gas and noble gases, e.g., argon.

The "first conduit" is a pipe made from, e.g., metal or glass which interconnects the reactant source with the reaction chamber. As will explained below, the first conduit is provided with at least two connecting pipe branches, one for introducing inactive gas (connected to the conduit at an inactive gas feed nozzle) and another for withdrawing inactive gas.

According to a preferred embodiment, the third conduit comprises an open gas flow channel. The term "open" means that the gas flow channel is not provided with a valve which can be completely closed. It can, however, be provided with flow restrictions such as capillars, which reduce the cross-section of the conduit. The third conduit, which by-passes the reaction chamber, drains the first conduit. In order to avoid condensation, it is maintained at a temperature equal to or higher than the condensation of the vapour-phase reactant. Preferably, the temperature is equal to or lower than the reaction temperature.

In some embodiments, in particular when there is a solid (powdery) reactant source, it is preferred to have a filter between the reactant source and the reaction chamber. In such embodiments, the second conduit can be connected to the first conduit at a point between the filter and the reaction chamber so as to create a one-way gas flow over the filter. In this embodiment, the gas phase barrier is formed between a purifying means and the reaction chamber. The second conduit can also be connected to the first conduit at a point between the reactant source and the filter.

The third (draining) conduit can be connected to the first conduit at a point between the connection point between the first conduit and the second conduit and the reactant source.

The unreacted vapour-phase reactants are withdrawn from the reaction chamber via an outlet conduit, and the third conduit is connected to that outlet conduit. It is, however, also possible to have the third conduit connected to a separate evacuation means.

According to a preferred embodiment, essentially all of any vapour-phase reactant from the reactant source is conducted via the third conduit to the drain between the feed of vapour-phase reactant pulses into the reaction chamber. Since the third conduit is not closed by a valve during the pulsing of reactants from the reactant source, there is a small flow of precursor from the source to the third conduit during pulsing of the reactant.

The flow of inactive gas through the third conduit is generally smaller than the flow of gas through the first conduit. However, on some occasion there may arise a need for growing the flow through the draining conduit. Typically the flow through the third conduit is about one fifth of that in the first conduit. Preferably it is less than 15%, in particular preferably 10% or less of the flow via the first conduit into the reaction chamber. In order to minimize reactant losses via the third conduit during pulsing, a fourth conduit can be connected to the third conduit. The fourth conduit is used for feeding inactive gas into the third conduit in the opposite direction to the flow of the gas withdrawn from the first conduit. Thus, the inactive gas fed from the fourth conduit will "push" the reactant vapours back towards the first conduit. A further advantage of separate inactive gas introduction into the third conduit is that the inert gas will be diluted with respect to the precursor, which will reduce the tendency of condensation.

In order to adjust the relative flow rates of the first and the third conduits, it is preferred to incorporate flow restrictors into the third conduit. Such a flow restrictor can be a static restriction such as a capillary portion which can be exchanged depending on the conditions. Since the static restriction contains no moving parts, the durability of it is good.

By feeding the inactive gas from the fourth conduit to a point above the restriction point (i.e. between the flow restriction and the connection point between the first conduit and the third conduit) it becomes possible to form a separated gas barrier zone during pulsing which will reduce the loss of precursor.

What is claimed is:

1. A method of growing a thin film onto a substrate placed in a reaction chamber according to the ALD method, said method comprising the steps of:
   vaporizing a reactant from a reactant source maintained at a vaporizing temperature;
   conducting the vaporized reactant to the reaction chamber via a first conduit;
   regulating the flow of said reactant so as to feed the reactant into said reaction chamber in the form of vapor-phase pulses repeatedly and alternately with vapor-phase pulses of at least one other reactant;
   causing said vapor-phase reactant to react with the surface of the substrate at a reaction temperature to form a thin film compound on said substrate;

feeding inactive gas into said first conduit via a second conduit, connected to the first conduit at a connection point, during the time interval between the vapor-phase pulses of the reactant so as to form a gas phase barrier against the flow of the vaporized reactant from the reactant source via the first conduit into the reaction chamber; and withdrawing the inactive gas from said first conduit via a third conduit connected to the first conduit, said third conduit being maintained at a temperature equal to or higher than the condensation of the vapor-phase reactant and being connected to the first conduit at a point upstream of the second conduit; and wherein regulating the flow of said reactant comprising choking of the reactant flow while still allowing a minimum flow of said reactant between the vapor-phase pulses.

2. The method according to claim 1, wherein regulating the flow of said reactant comprises operating a valve having an open and closed position such that the flow through the valve in the closed position is 1/10–10,000 of the flow of the open position of the valve.

3. The method according to claim 1, wherein regulating the flow of said reactant comprises operating a valve with a response time less than 100 ms.

4. The method according to claim 1, wherein regulating the flow comprises operating a valve disc operated by a precursor transfer gas and gravity.

5. The method according to claim 1, wherein regulating the flow comprises operating a modified MEC solenoid operated throttle valve.

6. The method according to claim 1, wherein regulating the flow comprises operating a pneumatic membrane type valve.

7. The method according to claim 1, wherein the same side carrier gas is choked in parallel with the precursor pulse being injected at a time.

8. The method according to claim 1, comprising choking an opposite side carrier gas in parallel with the vapor-phase pulse.

9. The method according to claim 1, wherein regulating the flow of said reactant comprises operating a non-fully closing valve that is placed inside a flow ratio sequencer.

10. The method according to claim 1, wherein regulating the flow of said reactant comprises operating a non-fully closing valve that is placed between a flow ratio sequencer and a precursor source.

11. The method according to claim 1, wherein regulating the flow of said reactant comprises operating a non-fully closing valve that is placed after a precursor source in the normal flow direction.

12. The method according to claim 1, wherein regulating the flow of said reactant comprises operating a non-fully closing valve that is placed in a conduit connected to the first conduit to provide a hot drain capillary.

13. The method according to claim 1, wherein feeding inactive gas into the first conduit comprises feeding, at least for some length of the first conduit, the inactive gas in opposite direction to the reactant flow.

14. The method according to claim 1, comprising maintaining the second conduit at a temperature equal to or lower than the reaction temperature.

15. The method according to claim 1, wherein the third conduit comprises an open gas flow channel.

16. The method according to claim 1, wherein feeding the inactive gas into the first conduit comprises feeding the inactive gas into the first conduit at a point downstream from the connection point at which the third conduit is connected to the first conduit to provide a flow of inactive gas which is directed in the opposite direction to the reactant flow in the first conduit.

17. The method according claim 1, conducting the vaporized reactant through a purifier that is provided in the first conduit and is selected from the group consisting of a filter, a ceramic molecular sieve and an electrostatic filter capable of separating dispersed liquid or solid droplets or particles or molecules of a minimum molecular size from the reactant gas flow.

18. The method according to claim 1, comprising conducting the vaporized reactant through a is an active purifier comprising functional groups capable of reacting with components present in the reactant gas flow.

19. The method according claim 1, wherein vaporizing a reactant from a reactant source comprises freeing a solid or liquid reactant from suspended liquid or solid particles in a filter placed in the first conduit along the flow path of the reactant to the reactant chamber.

20. The method according to claim 1, comprising conducting the vaporized reactant through a filter that is located downstream of where the second conduit is connected to the first conduit.

21. The method according to claim 1, comprising conducting the vaporized reactant such that there is a one-way gas flow over a filter.

22. The method according to claim 1, wherein feeding inactive gas into the first conduit via the second conduit comprises forming the gas phase barrier between a filter and the reaction chamber.

23. The method according to claim 1, wherein feeding inactive gas into the first conduit via the second conduit comprises feeding the inactive gas to the first conduit at a point between the reactant source and a filter.

24. The method according to claim 1, wherein withdrawing the inactive gas from said first conduit comprises withdrawing the inactive gas at a point between the connection point between the first conduit and the second conduit and the reactant source.

25. The method according to claim 1, wherein the reactant source is freely communicating with the first conduit.

26. The method according to claim 1, comprising withdrawing the unreacted vapor-phase reactants from the reaction chamber via an outlet conduit that is connected to the third conduit.

27. The method according to claim 1, comprising evacuating the third conduit through a separate evacuation device connected to the third conduit.

28. The method according to claim 1, wherein conducting the vaporized reactant to the reaction chamber comprises using the inactive gas as a carrier gas for the vaporized solid or liquid reactant.

29. The method according to claim 1, comprising withdrawing essentially all of any vapor-phase reactant from the reactant source that is conducted via the third conduit to a drain between the feed of vapor-phase reactant pulses into the reaction chamber.

30. The method according to claim 1, comprising maintaining a condensation vessel that is connected to the third conduit at a lower pressure and/or temperature in order to provide condensation of vaporized reactant residues.

31. The method according to claim 1, comprising feeding inactive gas into the third conduit through a fourth conduit.

32. The method according claim 31, comprising reducing the amount of gas withdrawn from the first conduit by feeding inactive gas into the third conduit.

33. The method according to claim 31, comprising feeding the inactive gas during pulsing of the reactant.

34. The method according to claim 31, wherein the inactive gas is fed into the third conduit at a point above any flow restrictor.

35. The method according to claim 1, wherein inactive gas is fed into the reaction chamber between the vapor-phase pulses of said reactants.

36. A method of using a non-fully closing valve in a method for growing a thin film onto a substrate placed in a reaction chamber according to the ALD method, said method comprising the steps of:

vaporizing a reactant from a reactant source maintained at a vaporizing temperature;

conducting the vaporized reactant to the reaction chamber via a first conduit;

regulating the flow of said reactant so as to feed the reactant into said reaction chamber in the form of vapor-phase pulses repeatedly and alternately with vapor-phase pulses of at least one other reactant;

causing said vapor-phase reactants to react with the surface of the substrate at areaction temperature to form a thin film compound on said substrate;

feeding inactive gas into said first conduit via a second conduit, connected to the first conduit at a connection point, during the time interval between the vapor-phase pulses of the reactant so as to form a gas phase barrier against the flow of vaporized reactant from the reactant source via the first conduit into the reaction chamber; and withdrawing the inactive gas from said first conduit via a third conduit connected to the first conduit, said third conduit being maintained at a temperature equal to or higher than the condensation of the vapor-phase reactant and being connected to the first conduit at a point upstream of the second conduit; and wherein regulating the flow of said reactant comprising choking of the reactant flow while still allowing a minimum flow of said reactant between the vapor-phase pulses.

* * * * *

UNITED STATES PATENT AND TRADEMARK OFFICE
CERTIFICATE OF CORRECTION

PATENT NO. : 6,881,263 B2
APPLICATION NO. : 10/333521
DATED : April 19, 2005
INVENTOR(S) : Lindfors et al.

It is certified that error appears in the above-identified patent and that said Letters Patent is hereby corrected as shown below:

In column 2, line 17, please delete "copending" and insert -- co-pending --.

In column 6, line 31, please delete "secm" and insert -- sccm --.

In column 6, line 62, please delete "the:" and insert -- the --.

In Claim 5, column 9, line 28, please delete "MEC" and insert -- MFC --.

Signed and Sealed this

Fourteenth Day of November, 2006

JON W. DUDAS
*Director of the United States Patent and Trademark Office*